United States Patent
Ho (10) Patent No.: US 10,971,464 B2
(45) Date of Patent: Apr. 6, 2021

(54) ELECTRICAL CONNECTION DEVICE AND CHIP MODULE CONNECTION DEVICE

(71) Applicant: LOTES CO., LTD, Keelung (TW)

(72) Inventor: Chien Chih Ho, Keelung (TW)

(73) Assignee: LOTES CO., LTD, Keelung (TW)

( * ) Notice: Subject to any disclaimer, the term of this patent is extended or adjusted under 35 U.S.C. 154(b) by 36 days.

(21) Appl. No.: 16/670,022

(22) Filed: Oct. 31, 2019

(65) Prior Publication Data

US 2020/0152592 A1 May 14, 2020

(30) Foreign Application Priority Data

Nov. 8, 2018 (CN) .......................... 201811325486.0

(51) Int. Cl.
| | |
|---|---|
| *H01L 23/00* | (2006.01) |
| *H01L 23/498* | (2006.01) |
| *H01L 23/538* | (2006.01) |
| *H01R 12/71* | (2011.01) |

(52) U.S. Cl.
CPC ........ *H01L 24/14* (2013.01); *H01L 23/49816* (2013.01); *H01L 23/5385* (2013.01); *H01L 23/5386* (2013.01); *H01R 12/716* (2013.01)

(58) Field of Classification Search
CPC ............... H01L 24/14; H01L 23/49816; H01L 23/5385; H01L 23/5386; H01R 12/716
See application file for complete search history.

(56) References Cited

U.S. PATENT DOCUMENTS

| | | | | |
|---|---|---|---|---|
| 6,731,516 B1* | 5/2004 | Ma | .......................... | H01R 12/57 361/785 |
| 8,235,734 B2* | 8/2012 | Ju | .......................... | H01R 12/57 439/83 |
| 9,917,386 B1* | 3/2018 | Ju | .......................... | H01R 33/74 |

FOREIGN PATENT DOCUMENTS

| | | |
|---|---|---|
| CN | 201004523 Y | 1/2008 |
| CN | 202067920 U | 12/2011 |
| CN | 202308413 U | 7/2012 |
| CN | 202855964 U | 4/2013 |
| CN | 206532913 U | 9/2017 |

* cited by examiner

*Primary Examiner* — Peniel M Gumedzoe
(74) *Attorney, Agent, or Firm* — Locke Lord LLP; Tim Tingkang Xia, Esq.

(57) ABSTRACT

An electrical connection device and a chip module connection device are disclosed. The electrical connection device includes: an insulating body, provided with multiple accommodating holes; multiple terminals, correspondingly accommodated in the accommodating holes; and multiple solder balls. Each accommodating hole is provided with a stopping portion. Each terminal has two arm portions and a stopping block located lower than the two arm portions, and the stopping block is formed by tearing downward from the accommodating groove. An accommodating groove is formed between the two arm portions and is located higher than the stopping block. The stopping portion is located on an upward moving path of the stopping block. A gap is formed between the stopping block and the stopping portion. The solder balls are correspondingly accommodated in the accommodating grooves of the terminals.

12 Claims, 6 Drawing Sheets

ELECTRICAL CONNECTION DEVICE AND CHIP MODULE CONNECTION DEVICE

CROSS-REFERENCE TO RELATED PATENT APPLICATION

This non-provisional application claims priority to and the benefit of, pursuant to 35 U.S.C. § 119(a), patent application Serial No. CN201811325486.0 filed in China on Nov. 8, 2018. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connection device and a chip module connection device, and in particular to an electrical connection device connected to a chip module and a chip module connection device.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A conventional electrical connector includes an insulating body, multiple terminals and multiple solder balls. The insulating body is provided with multiple accommodating holes respectively correspondingly accommodating the terminals. Each terminal is provided with multiple clamping portions for clamping a corresponding solder ball, and further provided with a stopping portion for stopping the corresponding solder ball in a direction in which the corresponding solder ball is loaded into the corresponding accommodating hole to limit the depth of the corresponding solder ball being loaded into the corresponding accommodating hole. Multiple barbs are provided at two opposite sides of each terminal to form an interference fit with the insulating body to fix the terminal. However, since the barb form an interference fit with the insulating body, the insulating body is squeezed to exert a force on the insulating body, and the insulating body is prone to warpage and deformation when soldering. Meanwhile, the formation of the barbs increases the complexity of the terminals during the forming process.

Therefore, a heretofore unaddressed need to design an improved electrical connection device and a chip module connection device exists in the art to address the aforementioned deficiencies and inadequacies.

SUMMARY

In view of the problems in the background, the present invention is directed to an electrical connection device and a chip module connection device that prevent warpage of the insulating body and facilitate formation of the terminals.

In order to achieve the foregoing objective, the present invention adopts the following technical solutions:

An electrical connection device includes: an insulating body, provided with a plurality of accommodating holes, wherein each of the accommodating holes is provided with a stopping portion; a plurality of terminals, correspondingly accommodated in the accommodating holes, wherein each of the terminals has two arm portions and a stopping block located lower than the two arm portions, the two arm portions are located at two opposite sides of the stopping block, an accommodating groove is formed between the two arm portions and is located higher than the stopping block, the stopping portion of a corresponding one of the accommodating holes is located on an upward moving path of the stopping block, a gap is formed between the stopping block and the stopping portion, a top surface of the stopping block has a resisting portion, and the resisting portion is located between the two arm portions; and a plurality of solder balls, correspondingly accommodated in the accommodating grooves of the terminals respectively, wherein the resisting portion of each of the terminals stops a corresponding one of the solder balls upward.

In certain embodiments, the stopping portion of each of the accommodating holes has a first stopping surface located at one side of a corresponding one of the solder balls and stopping the corresponding one of the solder balls.

In certain embodiments, each of the accommodating holes is provided with a second stopping surface for stopping the corresponding one of the solder balls, and the first stopping surface and the second stopping surface are located at two opposite sides of the accommodating groove of a corresponding one of the terminals.

In certain embodiments, the first stopping surface or the second stopping surface is an arc-shaped surface matched with the corresponding one of the solder balls.

In certain embodiments, the insulating body is provided with a reserved space, the reserved space and the two arm portions are located at two opposite sides of the stopping portion, and when the terminals are mounted into the accommodating holes downward from top thereof, the stopping block abuts the first stopping surface such that the stopping portion enters the reserved space and elastically deforms.

In certain embodiments, the stopping portion is connected to two opposite side surfaces of each of the accommodating holes, and the reserved space runs through the insulating body vertically and communicates with the accommodating holes.

In certain embodiments, the stopping block is formed by tearing downward from the accommodating groove.

In order to achieve the foregoing objective, another aspect of the present invention adopts the following technical solutions:

A chip module connection device includes: a chip module, provided with a plurality of solder pads; an electrical connection device, including: an insulating body, located below the chip module, wherein the insulating body is provided with a plurality of accommodating holes running therethrough, and each of the accommodating hole is provided with a stopping portion; and a plurality of terminals, correspondingly accommodated in the accommodating holes, wherein each of the terminals has two arm portions and a stopping block located lower than the two arm portions, the two arm portions are located at two opposite sides of the stopping block, an accommodating groove is formed between the two arm portions and is located higher than the stopping block, the stopping portion of a corresponding one of the accommodating holes is located on an upward moving path of the stopping block, a gap is formed between the stopping block and the stopping portion, a top surface of the stopping block has a resisting portion, the resisting portion is located between the two arm portions, and each of the terminals further has an insertion portion protruding downward from the corresponding one of the accommodating holes; a plurality of solder balls, correspondingly accommodated in the accommodating grooves of the terminals and correspondingly soldered to the solder pads, wherein the resisting portion of each of the terminals stops a corresponding one of the solder balls upward; and an electrical connector, located below the insulating body and comprising a plastic main body and a plurality of mating terminals accommodated in the plastic main body, wherein the insertion portions of the terminals are inserted into the insulating body and clamped by the mating terminals.

In certain embodiments, the insulating body is provided with a reserved space, the reserved space and the two arm portions are located at two opposite sides of the stopping portion, and when the terminals are mounted into the accommodating holes downward from top thereof, the stopping block abuts the stopping portion such that the stopping portion enters the reserved space and elastically deforms.

In certain embodiments, each of the terminals has a connecting portion, the two arm portions and the stopping block extend upward from the connecting portion, the insertion portion extends downward from the connecting portion, two opposite sides of the connecting portion have two inclined surfaces close to each other along a downward-from-top direction, and each of the accommodating holes is provided with two positioning portions corresponding to the two inclined surfaces to stop the connecting portion from moving downward.

In certain embodiments, the stopping block is formed by tearing downward from the accommodating groove.

In certain embodiments, the stopping portion of each of the accommodating holes has a first stopping surface, each of the accommodating holes is provided with a second stopping surface, and the first stopping surface and the second stopping surface are located at two opposite sides of the accommodating groove of a corresponding one of the terminals and jointly stop of a corresponding one of the solder balls.

Compared with the related art, the electrical connection device and the chip module connection device according to certain embodiments of the present invention have the following beneficial effects: the terminals do not need to form barbs. Instead, the stopping block for stopping the corresponding solder ball is matched with the insulating body to position each terminal, thereby facilitating formation of the terminals. Meanwhile, a gap is formed between the stopping block and the stopping portion, such that the stopping portion is in a loose fit when stopping the stopping block. Thus, the terminals do not squeeze the insulating body, thereby reducing stress received by the insulating body, and preventing warpage and deformation of the insulating body during soldering of the solder balls.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-6. In accordance with the purposes of this invention, as embodied and broadly described herein, this invention, in one aspect, relates to an electrical connection device and a chip module connection device.

Figure 6:
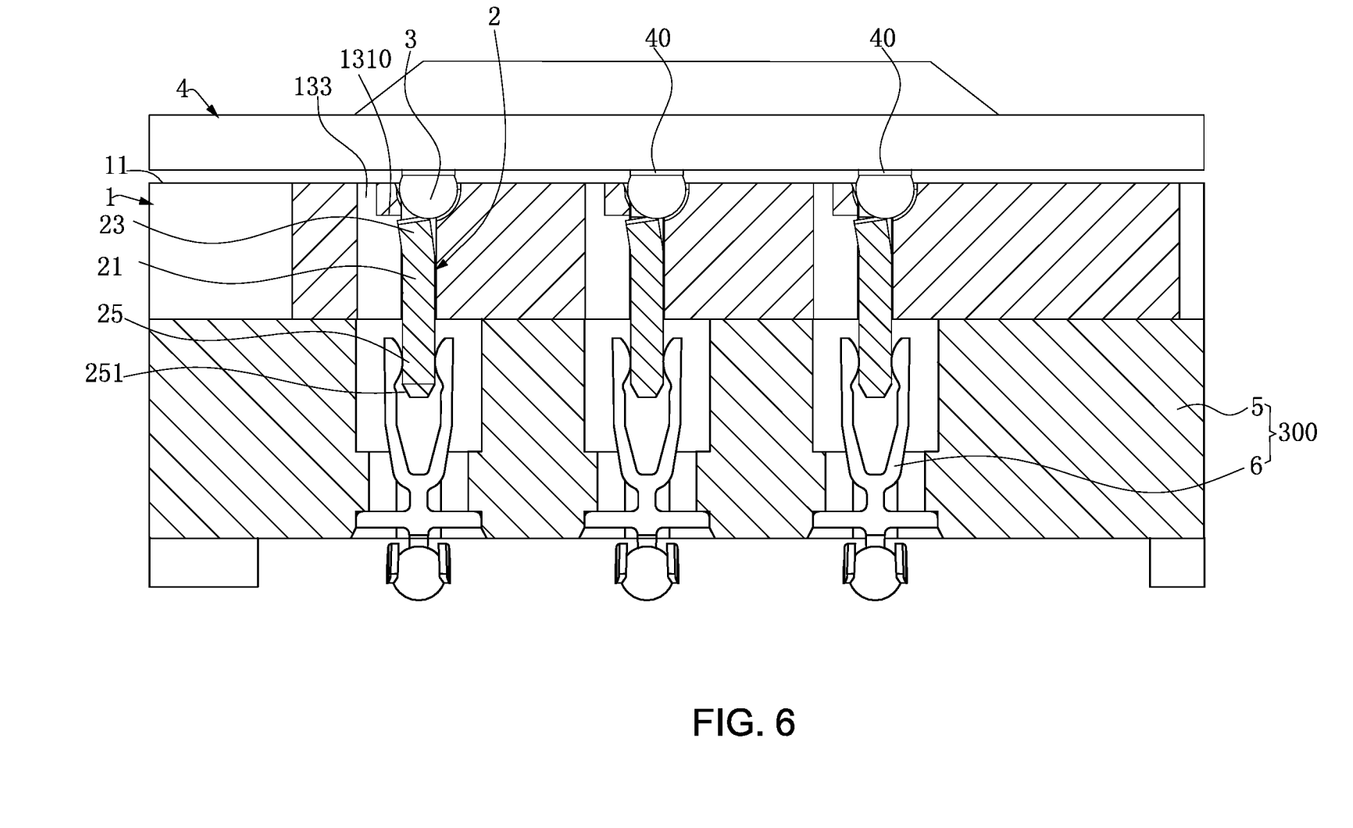
FIG. 6 is a plain sectional view of the chip module connection device according to certain embodiments of the present invention.

As shown in FIG. 6, the chip module connection device according to certain embodiments of the present invention includes a chip module 4, an electrical connection device 100 located below the chip module 4, and an electrical connector 300 located below the electrical connection device 100. The chip module 4 is provided with a plurality of solder pads 40. The electrical connection device 100 includes an insulating body 1, a plurality of terminals 2 inserted into the insulating body 1, and solder balls 3 accommodated in the terminals 2. The solder balls 3 are used for soldering with the solder pads 40 of the chip module 4. The electrical connector 300 includes a plastic main body 5 and a plurality of mating terminals 6 accommodated in the plastic main body 5.

Figure 2:
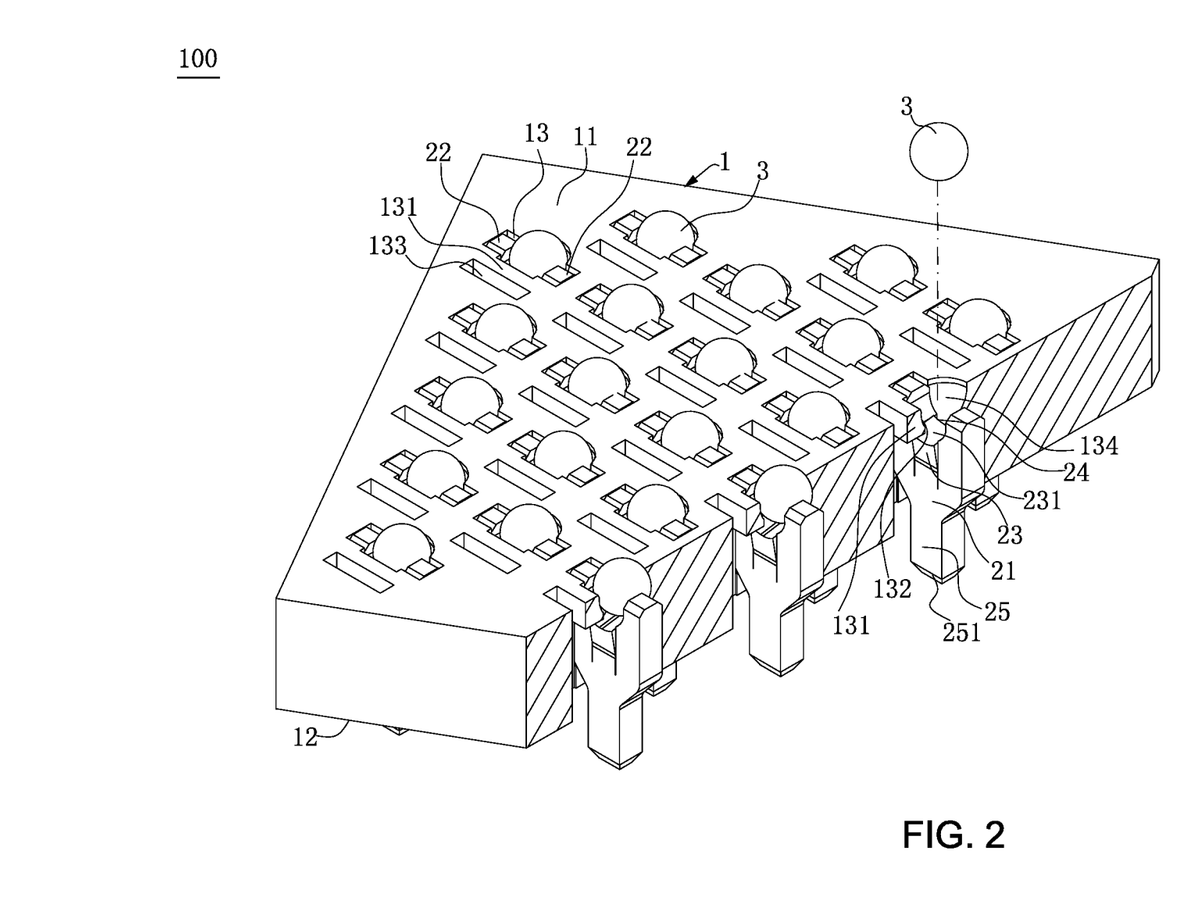
FIG. 2 is a perspective vertical sectional view of the electrical connection device according to certain embodiments of the present invention.
Figure 4:
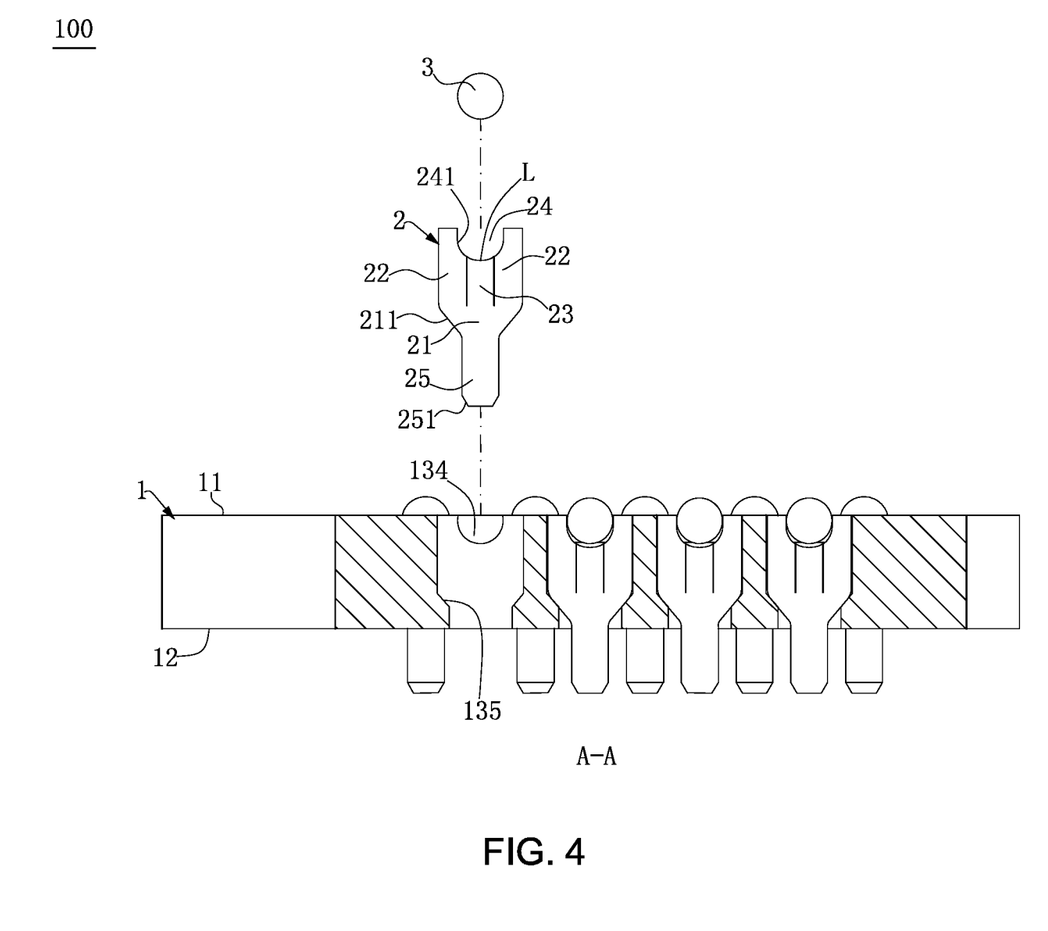
FIG. 4 is a plain sectional view of FIG. 3 along the A-A direction.
Figure 5:
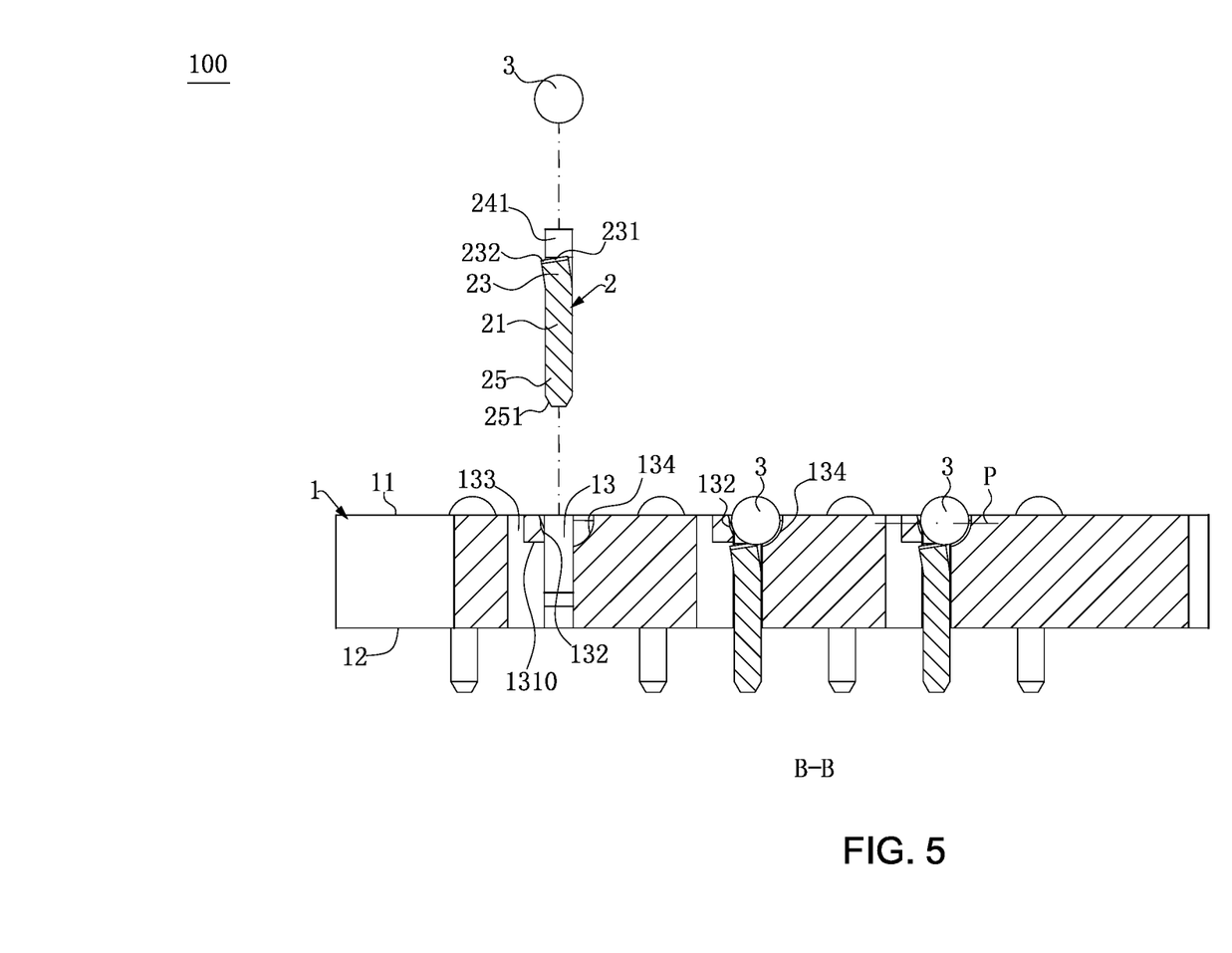
FIG. 5 is a plain sectional view of FIG. 3 along the B-B direction.

As shown in FIG. 2, FIG. 4 and FIG. 5, the insulating body 1 is provided with a plurality of accommodating holes 13. The insulating body 1 has an upper surface 11 and a lower surface 12 opposite to each other. The accommodating holes 13 run through the upper surface 11 and the lower surface 12. Each accommodating hole 13 has a stopping portion 131 connected to two opposite sides of the accommodating hole 13. A top surface of the stopping portion 131 is flush with the upper surface 11 and a bottom surface 1310 of the stopping portion 131 does not extend to the lower surface 12. The stopping portion 131 has a first stopping surface 132 located at one side of a corresponding solder ball 3 and stopping the solder ball 3. The insulating body 1 is provided with a reserved space 133 running through the upper surface 11 and the lower surface 12. The reserved space 133 communicates with the accommodating holes 13. The reserved space 133 and the first stopping surface 132 are located at two opposite sides of the stopping portion 131. A side wall of each accommodating hole 13 is depressed downward from the top end thereof to form a second stopping surface 134. The first stopping surface 132 and the second stopping surface 134 are both arc-shaped surfaces matched with the corresponding solder ball 3 and at least a portion is located below a horizontal central plane of the corresponding solder ball 3 to increase the contact area between the first stopping surface 132 and the second stopping surface 134 and the corresponding solder ball 3. Two opposite sides of each accommodating hole 13 are provided with two inclined positioning portions 135.

Figure 1:
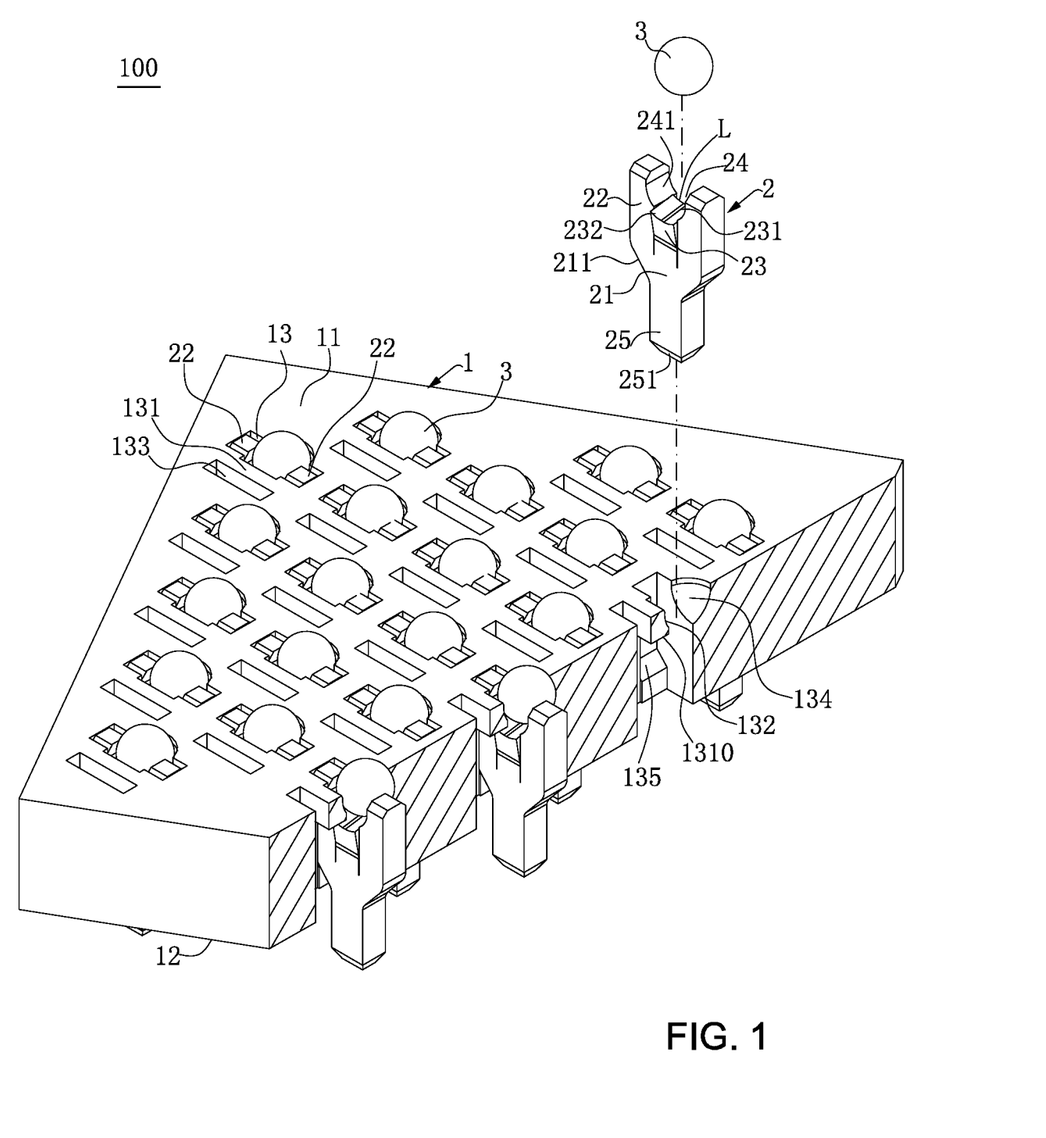
FIG. 1 is a perspective exploded sectional view of the electrical connection device according to certain embodiments of the present invention.

As shown in FIG. 1, FIG. 2 and FIG. 4, each terminal 2 has a connecting portion 21, and two opposite sides of the connecting portion 21 have two inclined surfaces 211 close to each other in a downward-from-top direction. The inclined surfaces 211 are parallel to the two inclined positioning portions 135, and the positioning portions 135 are located on a downward moving path of the inclined surfaces 211, such that the positioning portions 135 stop the terminal 2 from moving downward. A gap is formed between the positioning portions 135 and the inclined surfaces 211, such that the positioning portions 135 form a loose fit with the inclined surfaces 211, thereby allowing the terminal 2 to be movable downward in the corresponding accommodating hole 13 for a certain distance. Two arm portions 22 and a stopping block 23 extend upward from the connecting portion 21. The stopping block 23 is located lower than the two arm portions 22, and is formed by tearing downward between the two arm portions 22. An accommodating groove 24 is formed between the two arm portions 22 and is located higher than the stopping block 23. The accommodating groove 24 has an inner surface 241, and the inner surface 241 is an arc-shaped surface matched with the corresponding solder ball 3. The stopping block 23 is inclined toward the stopping portion 131 in the downward-from-top direction, such that a portion of the top surface of the stopping block 23 is located between the two arm portions 22 to form a resisting portion 231 to stop the solder ball 3 upward. A portion of the top surface of the stopping block 23 protrudes from the plate surface of the arm portion 22 to form a protruding portion 232, and the stopping portion 131 is located on an upward moving path of the protruding portion 232, such that the bottom surface 1310 of the stopping portion 131 stops the protruding portion 232 from moving upward. A gap is formed between the bottom surface 1310 of the stopping portion 131 and the protruding portion 232, such that the stopping portion 131 forms a loose fit with the protruding portion 232, thereby allowing the terminal 2 to be movable upward in the accommodating hole 13 for a certain distance. The top surface of the stopping block 23 is an arc-shaped surface, and an upper edge L of the arc-shaped surface is an arc matched with the corresponding solder ball 3. An insertion portion 25 extends downward from the connecting portion 21 to protrude downward from the corresponding accommodating hole 13 so as to be inserted into the plastic main body 5 of the electrical connector 300 and clamped by a corresponding mating terminal 6. A tail end of the insertion portion 25 is provided with a chamfer 251, allowing the insertion portion 25 to be inserted downward into the plastic main body 5 (as shown in FIG. 6). The connecting portion 21, the two arm portions 22 and the insertion portion 25 are all in flat plate shapes and are located on a same plane.

As shown in FIG. 2, during the insertion of the terminals 2 into the accommodating holes 13 downward from top thereof, the stopping block 23 interferes with the first stopping surface 132 of the stopping portion 131, such that the stopping portion 131 enters the reserved space 133 and elastically deforms, thereby reducing the force received by the insulating body 1. When the stopping block 23 passes downward beyond the first stopping surface 132, the stopping portion 131 elastically returns to its original shape, such that the stopping portion 131 is located above the protruding portion 232 and stops the protruding portion 232 from moving upward.

Figure 3:
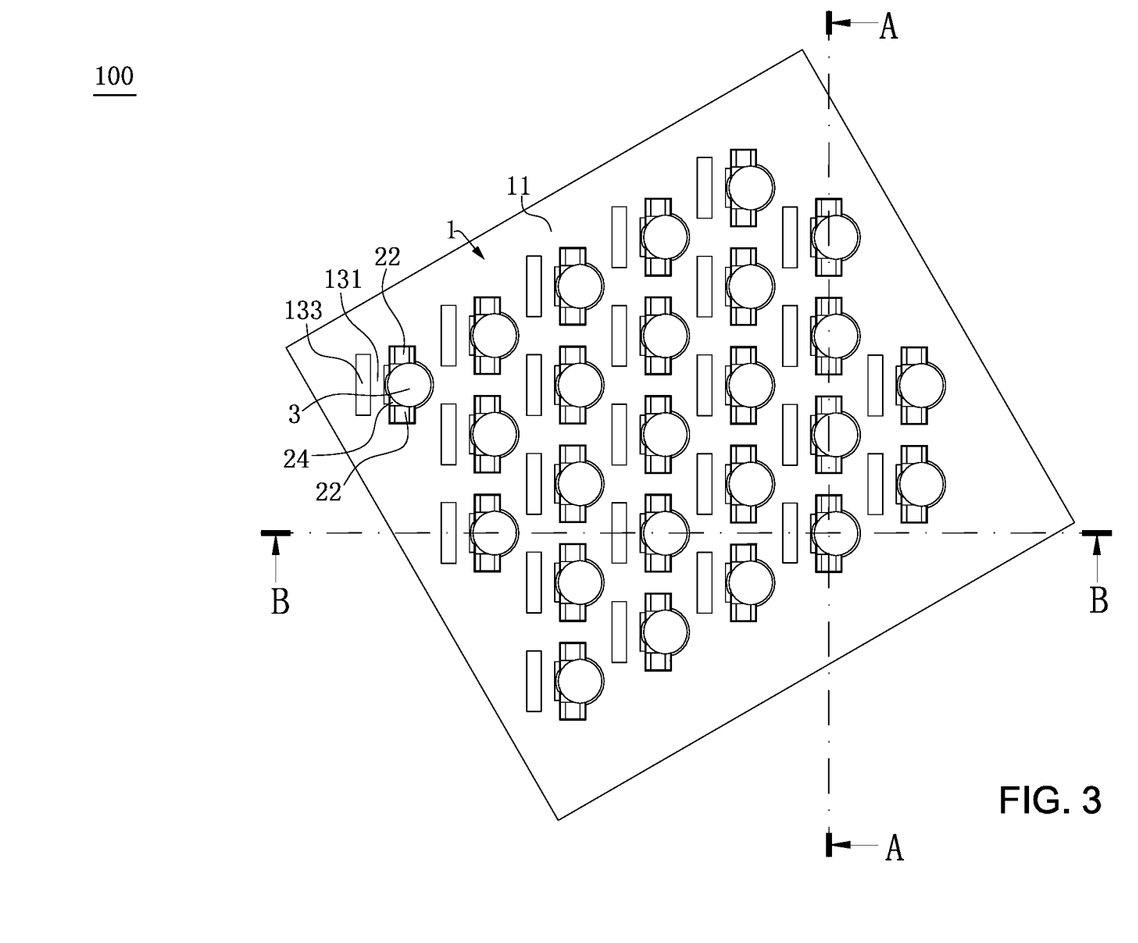
FIG. 3 is a top view of the electrical connection device according to certain embodiments of the present invention.

As shown in FIGS. 3 and 5, each solder ball 3 is accommodated in the accommodating groove 24 of a corresponding terminal 2. The solder ball 3 is stopped by the two arm portions 22 and is also stopped by the first stopping surface 132 and the second stopping surface 134. The first stopping surface 132 and the second stopping surface 134 are located at two opposite sides of the accommodating groove 24. The solder ball 3 is also stopped upward by the resisting portion 231.

To sum up, the electrical connection device 100 and the chip module connection device according to certain embodiments of the present invention has the following beneficial effects:

(1) The terminals 2 do not need to form barbs. Instead, the stopping block 23 for stopping the corresponding solder ball 3 is matched with the insulating body to position each terminal 2, thereby facilitating formation of the terminals 2. Meanwhile, a gap is formed between the stopping block 23 and the stopping portion 131, such that the stopping portion 131 is in a loose fit when stopping the stopping block 23. Thus, the terminals 2 do not squeeze the insulating body 1, thereby reducing stress received by the insulating body 1, and preventing warpage and deformation of the insulating body 1 during soldering of the solder balls 3. Further, the accommodating groove 24 is formed between the two arm portions 22 to accommodate the corresponding solder ball 3, and the stopping block 23 is formed by tearing downward from the accommodating groove 24, thereby facilitating formation of the terminals 2.

(2) Each solder ball 3 is stopped by the two arm portions 22 and is also stopped by the first stopping surface 132 and the second stopping surface 134, such that the solder ball 3 has a good coplanarity, ensuring the solder ball 3 to be well soldered to the chip module 4.

(3) The insulating body 1 has a reserved space 133 located at one side of the stopping portion 131. When the terminals 2 are inserted into the accommodating holes 13 downward from top thereof, the stopping block 23 interferes with the stopping portion 131, such that the stopping portion 131 enters the reserved space 133 and elastically deforms, thereby reducing the force received by the insulating body 1.

(4) The terminals 2 are correspondingly soldered to the soldering pads 40, and the insulating body 1 and the terminals 2 arranged in the insulating body 1 replace the high-cost circular pins on the chip module 4 in the conventional technology. When the terminals 2 in the insulating body 1 are soldered to the chip module 4, there is no need to assemble each circular pin one-by-one as in the conventional art, so the process is simple and saves working time. The terminals 2 are formed by stamping a plate, so the manufacturing cost thereof is low, thus saving the corresponding production cost. When a terminal 2 is damaged, the maintenance is relatively simple. The terminals 2 are arranged in the insulating body 1 at small intervals to facilitate a small interval arrangement of the terminals 2 on the chip module 4.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connection device, comprising:
an insulating body, provided with a plurality of accommodating holes, wherein each of the accommodating holes is provided with a stopping portion;
a plurality of terminals, correspondingly accommodated in the accommodating holes, wherein each of the terminals has two arm portions and a stopping block located lower than the two arm portions, the two arm portions are located at two opposite sides of the stopping block, an accommodating groove is formed between the two arm portions and is located higher than the stopping block, the stopping portion of a corresponding one of the accommodating holes is located on an upward moving path of the stopping block, a gap is formed between the stopping block and the stopping portion, a top surface of the stopping block has a resisting portion, and the resisting portion is located between the two arm portions; and
a plurality of solder balls, correspondingly accommodated in the accommodating grooves of the terminals respectively, wherein the resisting portion of each of the terminals stops a corresponding one of the solder balls upward.

2. The electrical connection device according to claim 1, wherein the stopping portion of each of the accommodating holes has a first stopping surface located at one side of a corresponding one of the solder balls and stopping the corresponding one of the solder balls.

3. The electrical connection device according to claim 2, wherein each of the accommodating holes is provided with a second stopping surface for stopping the corresponding one of the solder balls, and the first stopping surface and the second stopping surface are located at two opposite sides of the accommodating groove of a corresponding one of the terminals.

4. The electrical connection device according to claim 3, wherein the first stopping surface or the second stopping surface is an arc-shaped surface matched with the corresponding one of the solder balls.

5. The electrical connection device according to claim 2, wherein the insulating body is provided with a reserved space, the reserved space and the two arm portions are located at two opposite sides of the stopping portion, and when the terminals are mounted into the accommodating holes downward from top thereof, the stopping block abuts the first stopping surface such that the stopping portion enters the reserved space and elastically deforms.

6. The electrical connection device according to claim 5, wherein the stopping portion is connected to two opposite side surfaces of each of the accommodating holes, and the reserved space runs through the insulating body vertically and communicates with the accommodating holes.

7. The electrical connection device according to claim 1, wherein the stopping block is formed by tearing downward from the accommodating groove.

8. A chip module connection device, comprising:
a chip module, provided with a plurality of solder pads;
an electrical connection device, comprising:
an insulating body, located below the chip module, wherein the insulating body is provided with a plurality of accommodating holes running therethrough, and each of the accommodating holes is provided with a stopping portion; and
a plurality of terminals, correspondingly accommodated in the accommodating holes, wherein each of the terminals has two arm portions and a stopping block located lower than the two arm portions, the two arm portions are located at two opposite sides of the stopping block, an accommodating groove is formed between the two arm portions and is located higher than the stopping block, the stopping portion of a corresponding one of the accommodating holes is located on an upward moving path of the stopping block, a gap is formed between the stopping block and the stopping portion, a top surface of the stopping block has a resisting portion, the resisting portion is located between the two arm portions, and each of the terminals further has an insertion portion protruding downward from the corresponding one of the accommodating holes;

a plurality of solder balls, correspondingly accommodated in the accommodating grooves of the terminals and correspondingly soldered to the solder pads, wherein the resisting portion of each of the terminals stops a corresponding one of the solder balls upward; and an electrical connector, located below the insulating body and comprising a plastic main body and a plurality of mating terminals accommodated in the plastic main body, wherein the insertion portions of the terminals are inserted into the insulating body and clamped by the mating terminals.

9. The chip module connection device according to claim 8, wherein the insulating body is provided with a reserved space, the reserved space and the two arm portions are located at two opposite sides of the stopping portion, and when the terminals are mounted into the accommodating holes downward from top thereof, the stopping block abuts the stopping portion such that the stopping portion enters the reserved space and elastically deforms.

10. The chip module connection device according to claim 8, wherein each of the terminals has a connecting portion, the two arm portions and the stopping block extend upward from the connecting portion, the insertion portion extends downward from the connecting portion, two opposite sides of the connecting portion have two inclined surfaces close to each other along a downward-from-top direction, and each of the accommodating holes is provided with two positioning portions corresponding to the two inclined surfaces to stop the connecting portion from moving downward.

11. The chip module connection device according to claim 8, wherein the stopping block is formed by tearing downward from the accommodating groove.

12. The chip module connection device according to claim 8, wherein the stopping portion of each of the accommodating holes has a first stopping surface, each of the accommodating holes is provided with a second stopping surface, and the first stopping surface and the second stopping surface are located at two opposite sides of the accommodating groove of a corresponding one of the terminals and jointly stop of a corresponding one of the solder balls.

* * * * *